US00RE34638E

United States Patent [19]

Benedikt

[11] E Patent Number: Re. 34,638

[45] Reissued Date of Patent: Jun. 14, 1994

[54] LAMINATES OF POLYNORBORNENE AND POLYOLEFINS DERIVED FROM $C_2$-$C_4$ MONOMERS

[75] Inventor: George M. Benedikt, Solon, Ohio

[73] Assignee: The BF Goodrich Company, Akron, Ohio

[21] Appl. No.: 866,818

[22] Filed: Apr. 9, 1992

Related U.S. Patent Documents

Reissue of:

[64] Patent No.: 4,923,734
Issued: May 8, 1990
Appl. No.: 288,999
Filed: Dec. 23, 1988

[51] Int. Cl.[5] ..... B32B 9/00

[52] U.S. Cl. ..... 428/209; 428/220; 428/224; 428/260; 428/289; 428/290; 428/411.1; 428/457; 428/458; 428/480; 428/539.5; 428/332; 428/577; 428/615; 428/901; 156/228; 430/319; 430/311; 430/313; 430/315

[58] Field of Search ..... 428/209, 220, 224, 260, 428/289, 290, 411.1, 457, 458, 480, 539.5, 332, 577, 615, 901; 427/96; 156/60, 228; 430/311, 313, 315, 319

[56] References Cited

U.S. PATENT DOCUMENTS

| | | | |
|---|---|---|---|
| 3,318,758 | 5/1967 | Tell | 161/216 |
| 3,508,983 | 4/1970 | Origer et al. | 156/3 |
| 3,558,423 | 1/1971 | Rossetti, Jr. | 161/203 |
| 4,136,247 | 1/1979 | Tenney et al. | 526/283 |
| 4,178,424 | 12/1979 | Tenney et al. | 526/283 |
| 4,241,132 | 12/1980 | Pratt et al. | 428/288 |
| 4,292,106 | 9/1981 | Herschdorfer et al. | 156/243 |
| 4,315,970 | 2/1982 | McGee | 428/412 |
| 4,329,270 | 5/1982 | Meyer, Jr. et al. | 525/210 |
| 4,366,280 | 12/1982 | Yukawa | 524/304 |
| 4,372,800 | 2/1983 | Oizumi et al. | 156/307.3 |
| 4,418,178 | 11/1983 | Dewitt | 23/6 |
| 4,444,951 | 4/1984 | Mendelson | 525/210 |
| 4,451,317 | 5/1984 | Oizumi et al. | 156/307.3 |
| 4,571,279 | 2/1986 | Oizumi et al. | 156/270 |
| 4,639,285 | 1/1987 | Suzuki et al. | 156/272 |
| 4,831,094 | 5/1989 | Stein et al. | 526/280 |

FOREIGN PATENT DOCUMENTS

| | | |
|---|---|---|
| 0226956 | 1/1987 | European Pat. Off. . |
| 0353766 | 2/1990 | European Pat. Off. . |
| 3208198A1 | 9/1983 | Fed. Rep. of Germany . |

OTHER PUBLICATIONS

Coombs, "Printed Circuits Handbook" McGraw Hill 1988 pp. 34.2-34.3.

Chemical Abstract No. 72:124634r, "Hybrid Polyimide/Epoxy Glass Multilayer Fabrication".

Chemical Abstract No. 98:162024m, "Metal-Covered Laminates".

Chemical Abstract No. 98:162025n, "Metal-Covered Laminates".

Chemical Abstract No. 98:162026p, "Metal-Covered Laminates".

Chemical Abstract No. 105:135048d, "Multi-Layer Circuit Boards".

(List continued on next page.)

*Primary Examiner*—Patrick J. Ryan
*Assistant Examiner*—Pateick R. Jewik
*Attorney, Agent, or Firm*—Venable, Baetjer, Howard & Civiletti

[57] ABSTRACT

Printed wiring boards useful for high frequency applications are obtained by laminating a conductive foil pretreated with a silane to a polynorbornene prepreg wherein a sheet of polyolefin film derived from $C_2$-$C_4$ monomers is laminated between the prepreg and the foil to the surfaces of each member. The prepreg is made by impregnating a fiberglass cloth with a ring-opening polymerized polymer. The conductive foil is pretreated with a silane which is capable of improving the bond strength between the conductive foil and a norbornene copolymer.

45 Claims, No Drawings

OTHER PUBLICATIONS

Chemical Abstract No. 107:97841p, "Polycyclic Olefin Laminated Boards".
Chemical Abstract No. 107:8574p, "Epoxy Prepregs for Printed-Wiring Boards".
Chemical Abstract No. 107:8575q, "Epoxy Prepregs for Printed-Wiring Boards".
WPI No. 83-00996K/01, "Metal Glass Laminated Plate Manufacture Using Adhesive Comprising Silyl-Modified Organic Polymer".
WPI No. 83-759725/37, "Bonding Copper Foil to Backing Material Using Silane Compound as Adhesion Promoter; PCB Print Circuit Board".
WPI No. 74-34559V/19, "Metallised Plastic Substrate, e.g., Electronic Circuit—By Laminating Pretreated Metal Sheet with Plastic Substrate, Removing Metal Layer, and Metallising Exposed Surface".
WPI No. 85-162927/27, "Copper Coated Laminated Plate Production for PCB, Using Unsaturated Resin, e.g., Polyester or Vinyl Ester to Impregnate Base Material".
"Today's Substrates", Murray, *Circuits Manufacturing,* Nov. 1987, p. 25.
"G-10FR Epoxy/Glass Fabric General Purpose Laminate", Norplex, Product Bulletin.
"Adhesion in Mineral-Organic Composites", D. M. Brewis, D. Briggs, John Wiley & Sons, *Industrial Adhesion Problems,* Chapter 6.
*The Kirk-Othmer Encyclopedia of Chemical Technology,* John Wiley & Sons, 1982, vol. 20.
"Some Approaches to Low Dielectric Constant Matrix Resins for Printed Circuit Boards", Butler et al., 15th National SAMPE Technical Conference, 1983.

LAMINATES OF POLYNORBORNENE AND POLYOLEFINS DERIVED FROM $C_2$-$C_4$ MONOMERS

Matter enclosed in heavy brackets [ ] appears in the original patent but forms no part of this reissue specification; matter printed in italics indicates the additions made by reissue.

BACKGROUND OF THE INVENTION

This invention relates to printed circuit wiring boards composed of a polynorbornene substrate laminated to a conductive foil, with a layer of polyolefin film derived from $C_2$–$C_4$ monomers sandwiched therebetween, using silane coupling agents.

A purpose of the present invention is to produce printed circuit wire boards which have a low dielectric constant and high bonding strength.

Such laminates are generally compared in the market place for dielectric constant, dissipation factor, chemical resistance, peel strength, solder bath resistance (at 260° C. to 288° C.), warping and punchability.

In conventional processes, so called "prepregs" are made by dipping a pretreated fibrous substrate (fiberglass) in Epoxy or some other solution of polymer resin having good strength and electrical insulating properties and drying the fibrous substrate to remove the solvent and provide a resin-impregnated substrate. It is known to treat the glass substrate with a silane compound to promote the adhesion between the substrate and the resin.

Cellulosic and fiberglass woven materials have long been used to reinforce polymer substrates. It is known silane coupling agents can be applied directly to glass filaments to improve the flexural strength of glass cloth laminates of a variety of resins, often by as much as 300 percent for compression molded test samples. Silane coupling agents at the interface allow many particulate minerals to become reinforcing fillers in composites to increase strength, hardness, modulus, heat distortion and impact strength. Fiberglass cloth is usually treated with an aqueous coupling agent.

Two or more of these prepregs are then pressed together to form an insulating layer for a printed circuit wiring board. To provide the conducting layer for the laminate, one or more copper layers are generally pressed against the exposed surfaces of these prepregs.

CA98:162024m discloses laminates for use in preparing printed circuit boards. The laminates comprise an assembly of prepregs of paper-reinforced phenolic resin and copper foil. Polyethylene may be used as an intermediate layer between the copper foil and the prepregs. CA98:162025n and 98:162026p disclose similar laminates wherein the polyethylene layer is silane-modified.

CA107:97841p discloses laminated boards prepared from cotton linter paper coated with polycyclic olefin monomers. The paper, monomers and a catalyst are sandwiched with copper foil and a polypropylene film and pressed at elevated temperatures.

CA107:8574p discloses laminates of glass fibers impregnated with silicon-modified epoxy resins which also contain polyethylene. A six-layered wiring board is prepared from 15 sheets of the prepreg and 6 sheets of copper foil. CA107:8575q discloses similar laminates wherein epoxy resins, guanidine derivatives, fluoroplastics or polyolefins are employed as the resin.

"Some Approaches to Low-dielectric Constant Matrix Resins for Printed Circuit Boards", Butler et al., 15th National SAMPE Technical Conference, 1983, discloses general design considerations in the preparation of printed circuit boards. It discloses that the thermal cyclization of materials to form multicyclic structures has been employed in the preparation of printed circuit boards. It also discloses that coupling agents to improve adhesion can be employed.

Other methods of applying metals to these insulating layers or substrates include vapor deposition, electroplating, sputtering, ion plating, spraying and layering. The metals commonly used are copper, nickel, tin, silver solder, gold aluminum, platinum, titanium, zinc and chrome, with copper being used most often in printed wire boards.

A problem associated with forming thin metallic coatings on insulating layers or substrates has been the inability to form a complete bond having excellent bond strength between the metallic layer and the substrate and subsequently good solder resistance.

Silane compounds have found wide acceptability for improving adhesion between different substrates.

Silane coupling agents modify the interface between metal or mineral surfaces and organic resins to improve adhesion between the surface and the resin. The physical properties and water resistance of the reinforced resins are thereby improved. It is believed that silane coupling agents form bonds with metal surfaces through the silane functional group. The hydrolyzed silanes will condense to oligomeric siloxanols and eventually to rigid cross-linked structures. Contact with a polymer matrix should take place while the siloxanols still have some solubility. Bonding to a polymer matrix may take different forms or a combination of forms. Bonding may be covalent where the oligomeric siloxanol is compatible with the liquid matrix resin. The solutions might also form an interpenetrating polymer network as the siloxanols and the resin separately cure with only limited copolymerization.

It is well known that not all silanes or mixtures of silanes will bond all metals to all substrates. McGee, U.S. Pat. No. 4,315,970, states that:

> "[i] t is generally accepted that specific silanes can be used for adhesion of specific materials to specific substrates. That is, the silane must be matched to the application and it cannot be assumed that all silanes will work in all applications."

Therefore, the suitability of a silane bonding agent in improving adhesion of a metal to a substrate is unpredictable and it must be determined by experimentation.

While suitable coupling agents are commercially available for bonding of many common plastics with a variety of metals, it is believed that the application of silane coupling agents for bonding of polynorbornenes to metals is not known in the prior art. Norbornene type monomers are polymerized by either a ring-opening mechanism or by an addition reaction wherein the cyclic ring structure remains intact. Ring-opening polymerizations are discussed with greater particularity in U.S. Pat. Nos. 4,136,247 and 4,178,424, assigned to the same assignee as the present invention and are incorporated herein by reference for their discussion of such polymerizations. Ring-opening polymerization generally yields unsaturated linear polymers while addition polymerization yields polycycloaliphatics. It is desirable to produce polymers having high molecular weight monomers incorporated therein to provide good temperature resistance, i.e., high heat distortion temperatures and high glass transition temperatures.

SUMMARY OF THE INVENTION

Printed wiring boards of the present invention comprise a polynorbornene core laminated to a conductive foil. The printed wiring boards of this invention are used mainly for high frequency applications. It has been found that when conductive foil, for example a copper foil of the type generally used for printed wiring boards is pretreated with certain silane compounds and then laminated to a prepreg core of polynorbornene copolymer, with an intermediate layer of polyolefin derived from $C_2$–$C_4$ monomers therebetween, at temperatures above the glass transition (Tg) temperature of the polymer, a printed wiring board having improved adhesion, solvent resistance and resistance to [lo] blistering is obtained.

The prepregs are produced from a solution of polymers obtained from polymerization of norbornene type monomers with a variety of compounds. To provide the prepregs, a non-cellulosic cloth is impregnated with the polymer solution and allowed to dry until the solvent content is about 2.5% by weight or below. Preferably this cloth is pretreated with silane coupling agent. The copper foil is pretreated with a silane compound that has been found to be useful as a coupling agent between polynorbornene and the foil. This copper foil is typically about 35 microns thick and has a dendritic bronze surface. One or more of the prepregs are stacked between two or more sheets of polyolefin and two copper foils (one on each surface) and lamination is carried out at up to 1,100 psi and up to 250° C.

The resulting printed wiring board shows improved peel strength of at least about 6 pounds/inch, preferably between 6 and 15 pounds per inch of width for a ½" wide strip when measured at a pull angle of 180 degrees. These printed wire boards have a dielectric constant below 3.5, preferably below 3.1, and a dissipation factor below 0.005, preferably below 0.003, at 1 MHZ when the ratio of polymer to reinforcing support ranges from about 40:60 to about 80:20 with Entype fiberglass as the support and from about 30:70 to about 80:20 when the reinforcing support has a lower dielectric constant than E-glass.

These printed wire boards show low solvent swellings at room temperature in methylene chloride of less than 40%, preferably less than 25% and even more preferably less than 15% in a 60 mil thick sample. They have a coefficient of thermal expansion normal to the plane of the board surface preferably below 80 ppm/°C. The laminates are preferably resistant to the thermal stress in a solder bath at 260° C. for at least 20 seconds without copper delamination or blistering. The polyolefin film also provides for oxidation resistance when the conductive metal film is etched away. Polyethylene is a preferred polyolefin.

In one aspect of this invention a process is provided for producing a laminate. The process comprises (a) a polynorbornene dipping solution comprised of polynorbornene polymers within a solvent; (b) impregnating a non-cellulosic cloth with the dipping solution and drying said impregnated cloth to remove a substantial portion of solvent to form a substrate layer; (c) pretreating the surface of a conductive metal film with a solution of a silane compound suitable for increasing the bond strength between the substrate layer and the conductive layer; (d) sandwiching a layer of polyolefin, preferably polyethylene, between the substrate layer and the conductive layer; and (e) laminating the polyethylene layer to the substrate layer and the metallic film across the substrate layer and pretreated copper layer.

In another aspect, laminates so produced are provided.

DETAILED DESCRIPTION OF THE INVENTION

The present invention provides laminates, such as printed wire boards, having superior dielectric properties by laminating a substrate layer, such as one or more prepregs of fiberglass-reinforced polynorbornene polymer to a conductive foil, for example a copper foil, utilizing a silane coupling agent and an intermediate layer of polyethylene.

In the present invention, the prepregs are derived from a polynorbornene dipping solution. This polynorbornene dipping solution comprises solubilized polynorbornene polymers. These polymers are obtained from the metathesis ring-opening polymerization of cycloolefin monomers having a norbornene functional group.

These cycloolefin monomers are characterized by the presence of at least one norbornene moiety in its structure identified below:

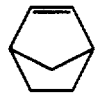

Suitable cycloolefin monomers include substituted and unsubstituted norbornenes, dicyclopentadienes, dihydrodicyclopentadienes, trimer of cyclopentadiene, tetracyclododecenes, hexacycloheptadecenes, ethylidenyl norbornenes and vinylnorbornenes. Substituents on the cycloolefin monomers include hydrogen, alkyl, alkenyl, and aryl groups of 1 to 20 carbon atoms, and saturated and unsaturated cyclic groups of 3 to 12 carbon atoms which can be formed with one or more, preferably two, ring carbon atoms. In a preferred embodiment, the substituents are selected from hydrogen and alkyl groups of to 2 carbon atoms. Generally speaking, the substituents on the cycloolefin monomers can be any which do not poison or deactivate the polymerization catalyst. Examples of the preferred monomers referred to herein include, dicyclopentadiene,
methyltetracyclododecene,
2-norbornene,
and other norbornene monomers such as
5-methyl-2-norbornene,
5,6-dimethyl-2-norbornene,
5-ethyl-2-norbornene,
5-ethylidenyl-2-norbornene [(or5-ethylidene-norbornene] *(or 5-ethylene-norbornene)*,5-butyl-2-norbornene,
5-hexyl-2-norbornene,
5-octyl-2-norbornene,
5-phenyl-2-norbornene,
5-dodecyl-2-norbornene,
5-isobutyl-2-norbornene,
5-octadecyl-2-norbornene,
5-isopropyl-2-norbornene,
5-phenyl-2-norbornene,
5-p-toluyl-2-norbornene, 5-α-naphthyl-2-norbornene,
5-cyclohexyl-2-norbornene,
5-isopropenyl-norbornene,
5-vinyl-norbornene,
5,5-dimethyl-2-norbornene,
tricyclopentadiene (or cyclopentadiene trimer),
tetracyclopentadiene (or cyclopentadiene tetramer),
dihydrodicyclopentadiene (or cyclopentenecyclopentadiene co-dimer),
methyl-cyclopentadiene dimer,
ethyl-cyclopentadiene dimer,
tetracyclododecene
9-methyl-tetracyclo[6,2,1,$1^{3,6}$,$O^{2,7}$]dodecene-4, (or methyl-tetracyclododecene)
9-ethyl-tetracyclo[6,2,1,$1^{3,6}$,$O^{2,7}$]dodecene-4, (or ethyl-tetracyclododecene)
9-propyl-tetracyclo[6,2,1,$1^{3,6}O^{2,7}$]dodecene-4,
9-hexyl-tetracyclo[6,2,1,$1^{3,6}$,$O^{2,7}$]dodecene-4,
9-decyl-tetracyclo[6,2,1,$1^{3,6}$,$O^{2,7}$]dodecene-4,
9,10-dimethyl-tetracyclo[6,2,1,$1^{3,6}$,$O^{2,7}$]dodecene-4,
9-methyl, 10-ethyl-tetracyclo[6,2,1,$1^{3,6}$,$O^{2,7}$]dodecene-4,
9-cyclohexyl-tetracyclo[6,2,1,$1^{3,6}$,$O^{2,7}$]dodecene-4,
9-chloro-tetracyclo[6,2,1,$1^{3,6}$,$O^{2,7}$]dodecene-4,
9-bromo-tetracyclo[6,2,1,$1^{3,6}$,$O^{2,7}$]dodecene-4,
9-fluoro-tetracyclo[6,2,1,$1^{3,6}$,$O^{2,7}$]dodecene-4,
9-isobutyl-tetracyclo[6,2,1,$1^{3,6}$,$O^{2,7}$]dodecene-4,
9,10-dichloro-tetracyclo[6,2,1,$1^{3,6}$,$O^{2,7}$]dodecene-4.

This invention especially contemplates the use of one or more of the following monomers so as to provide either homopolymers or copolymers upon polymerization. Copolymers are defined as polymers composed of two or more monomers:
norbornene,
5-vinyl-norbornene,
methylnorbornene,
tetracyclododecene,
methyltetracyclododecene,
dicyclopentadiene,
5-ethylidenyl-2-norbornene,
hexacycloheptadecene, and
tricyclopentadiene.

Other monomers can form part of the polynorbornenes such as non-conjugated acyclic olefins, monocyclic olefins and diolefins. The non-conjugated acyclic olefins act as chain terminators. Terminal olefins are most preferred, e.g., alpha-olefins. Thus monomers like hexene-1 are preferred while 1-butene, 2-pentene, 4-methyl-2-pentene, and 5-ethyl-3-octene are suitable also. They are typically used at a molar ratio of 0.001:1 to 0.5:1 acyclic olefin to cycloolefin monomer.

The polynorbornenes used in forming the printed wire boards of the present invention are obtained by solution polymerization. For solution polymerization, the catalyst preferably comprises molybdenum or tungsten salts and the co-catalyst preferably comprises dialkylaluminum halides, alkylaluminum dihalides, alkylalkoxy halide or a mixture of trialkylaluminum with an iodine source.

Examples of useful molybdenum and tungsten salts include the halides such as chlorides, bromides, iodides, and fluorides. Specific examples of such halides include molybdenum pentachloride, molybdenum hexachloride, molybdenum pentabromide, molybdenum hexabromide, molybdenum pentaiodide, molybdenum hexafluoride, tungsten hexachloride, tungsten hexafluoride and the like. Other representative salts include those of acetylacetonates, sulfates, phosphates, nitrates, and the like. Mixtures of salts can also be used. For polymerization results, the more preferred salts are the molybdenum halides, especially molybdenum pentahalides such as $MoCl_5$.

Specific examples of co-catalysts for ring-opening solution polymerization include alkyl-aluminum halides such as ethylaluminum sesquichloride, diethylaluminum chloride, diethylaluminum iodide, ethylaluminum diiodide, propylaluminum diiodide and ethylpropylaluminum iodide and a mixture of triethylaluminum and elemental iodine.

For solution polymerization, the molybdenum or tungsten salt is generally employed at a level from about 0.01 to about 50 millimoles per mole of total monomer, preferably from about 0.5 to about 10 millimoles per mole of total monomer and, the organoaluminum compounds described above are generally used in a molar ratio of organoaluminum compound to molybdenum and/or tungsten salt(s) from about 10/1 to about ⅛, preferably from about 5/1 to about 3/1. Both catalyst and co-catalyst for solution polymerization are normally added at the time of polymerization.

Suitable solvents used for the solution polymerization and in forming the dipping solution include aliphatic and cycloaliphatic hydrocarbon solvents containing 4 to 10 carbon atoms such as cyclohexane, cyclooctane and the like; aromatic hydrocarbon solvents containing 6 to 14 carbon atoms which are liquid or easily liquified such as benzene, toluene, xylene and the like, and substituted hydrocarbons wherein the substituents are inert such as dichloromethane, chloroform, chlorobenzene, dichlorobenzene and the like. Optionally present within the dipping solution are curing agents which initiate radical cross-linking such as the peroxides, di-t-butyl peroxide, or 2,5-dimethyl-2,5-di(t-butylperoxy)-hexyne-3. Antioxidants such as hindered phenol antioxidants (Ethyl 330) and polyunsaturated monomeric or oligomeric cross-linkers such as trimethylol propane triacrylate are also optional. The dipping solution has a solids content of preferably about 10% to about 40%. Dipping solutions having concentrations both above and below this range can be used in forming the laminates of the invention.

The dipping solution is impregnated into a non-cellulosic cloth, such as fiberglass to form a substrate layer, often referred to as a prepreg. The cloth may be woven or non-woven. Many glass cloth materials having a variety of surface characteristics are available commercially. In the present invention Entype Fiberglass cloth, style 2116, having a surface finish type 642 or 627 (which refers to a silane treatment) made by Burlington Industries is preferred. The non-cellulosic cloth is impregnated by immersing it in the dipping solution of the polynorbornene diluted in an organic solvent. This can be accomplished at ambient temperatures or at the temperatures above or below ambient temperatures.

The glass cloth may be pretreated with a silane solution. A preferred class of pretreating agents is the styryl diamino silanes.

The prepreg so produced is typically dried at temperatures between ambient temperature and about 150° C. At final stages of drying the temperature is preferably maintained above the glass transition temperature (Tg) of the polymer to permit the solvent to diffuse out. If curing agents are present, the temperature is kept sufficiently low to prevent activation of radical cross-linking.

The laminates produced by the present invention incorporate a conductive foil, preferably a copper film with a copper surface layer, such as copper foil. This copper foil can be the surface layer of other metallic films. The copper surface layer is pretreated with a silane solution which increases the bond strength between the polyethylene layer, the substrate and the copper surface layer. Preferably, copper foil of the type manufactured for printed wiring boards with a matte side for lamination to a prepreg is pretreated with such a solution of silane coupling agent before being laminated to the prepreg. Such copper foils are typically about 35 microns thick and have a dendritic bronze matte surface.

It is also feasible to employ a composite conductive sheet in which one face of the sheet is copper and the other is an appropriate metal such as tin, silver, gold, solder, aluminum, platinum, titanium, zinc, chrome, or an alloy of one or more of these metals with each other or copper. Additionally, the conductive foil may be composed of entirely only one of the above metals. Particularly suitable metal foils or films are available from Gould, Inc.

According to the present invention several silanes were found to be preferred for bonding substrate layers of polynorbornene impregnated glass to copper layers. The silane coupling agent is preferably in solution at concentrations ranging from about 1% to 10% by weight. Suitable silanes include:

3-methylacryloyloxypropyltrimethoxysilane,
3-(N-styrylmethyl-2-aminoethylamino)propyltrimethoxysilane hydrochloride
3-(N-allyl-2-aminoethylamino)-propyltrimethoxy-silane hydrochloride,
N-(styryimethyl)-3-aminopropyltrimethoxysilane hydrochloride,
N-2-aminoethyl-3-aminopropyltrimethoxysilane, and
3-(N-benzyl-2-aminoethylamino)-propyltrimethoxy silane hydrochloride.

The laminates of this invention also include a polyethylene layer disposed between the copper foil and the substrate. Advantageously, the polyethylene is in the form of a film or very thin sheet.

Suitable film thicknesses include films of up to about 10 mils in thickness. If thicker films are employed, the thermal coefficient of expansion of the resultant laminate increases. Preferred thicknesses are those of less than 5 mils, preferably 1.5 mils or less and most preferably less than 1.5 mils.

Virtually any linear or branched polyolefin film derived from $C_2$–$C_4$. monomers is suitable to be employed in the invention. The molecular weight of the polyolefin is not critical. The film need not be oriented. Thus, any polyolefin film meeting the above thickness parameters may be employed. By providing polyolefin in thin film form, good plastic flow is achieved when the laminate is subjected to heat and pressure. It is believed that as the polyolefin film undergoes this plastic flow, the polyolefin cross-links with the norbornene of the prepreg, providing improved adhesion.

The polyolefin film can also be employed between sheets of prepreg. Thus, the various layers of prepreg, polyolefin and copper can be in various orders, although, generally, the copper is on the exterior surface. Thus, it is possible to arrange or stack the various layers in the following fashion:

Copper/polyolefin/prepreg/polyolefin/prepreg/-polyolefin/copper Other stacking sequences will be readily apparent to those of ordinary skill in the art. Following arranging the layer in such a sequence, they are laminated to each other essentially concurrently. It will be appreciated by those of ordinary skill in the art that the polyolefin/prepreg/polyolefin sequence can be repeated as often as desired. It will also be appreciated that each layer can contain as many prepregs as desired and that as many polyelefin layers as desired may be employed.

Examples of suitable $C_2$–$C_4$ olefins include ethylene (ethene), propylene (propene) and butylene (butene). Thus, suitable polyolefins include polyethylene, polypropylene and polybutylene. Polyethylene has been found to be particularly suitable. However, when used herein it will be readily understood that polyethylene can be interchanged with the other polymers derived from $C_2$–$C_4$ olefins. Moreover, mixtures of such polymers and polymers derived from mixtures of such monomers can be employed.

The laminates of this invention have two major surfaces and four edge surfaces. The major surfaces are generally parallel to the plane of the laminations.

Laminates of this invention also comprise multi-layer printed circuit boards. Multi-layer printed circuit boards are similar to single layer printed circuit boards except that the copper/polyolefin/prepregs/-polyolefin/copper unit can be repeated any number of times. Thus, multi-layer circuit boards containing circuits at various layers can be fabricated. Generally, multi-layer circuit boards are prepared by first preparing a copper/polyolefin/prepregs/polyolefin/copper unit. The copper is then subjected to conventional photoresist imaging techniques and etched. An etched pattern results, which is capable of functioning as a circuit. The outside of the remaining copper layer is preferably oxidized with a conventional oxidant. Thereafter, an additional polyolefin/polynorbornene/polyolefin/copper unit is laminated to the etched copper side of the substrate such that the additional copper layers are on the outside. This process is continued until the desired number of layers of the multi-layer laminate is reached. Methods of fabricating multilayer printed circuit boards, including those steps in this invention which are conventional, are disclosed in Printed Circuits Handbook, Coombs Jr., editor-in-chief, McGraw-Hill, 1979, Chapter 22, which is hereby incorporated by reference herein.

The laminates, such as printed wire boards, are finished by laminating the pretreated copper layer to the substrate layer (prepreg) with the polyolefin film layer therebetween. Thus, the polyolefin film is sandwiched between the prepreg substrate and the copper foil such that the polyolefin is bonded to each surface. Lamination is accomplished in a heated press using pressures above about 700 psi, preferably above 1000–1100 psi and at temperatures between ambient temperature and 250° C., but preferably between 170° C. and 190° C. Preferably the temperature is above the glass transition temperature of the polynorbornene and sufficiently high to activate any peroxide curing agents. At such temperatures, any peroxide curing agent present in the polymer releases an oxygen free radical which causes cross-linking. Cross-linking provides strength and chemical resistance to the boards. Generally a stack of prepregs may be pressed between a pair of pretreated copper foils. The pretreated bronze side of the copper foil is placed in contact with the prepreg. The laminates resulting from the process of this invention are used in the manufacture of printed circuit boards (printed circuit wiring boards). A very basic way in which the laminates of the invention can be employed to make printed circuit boards can be found in CMOS Cookbook, Lancaster, Sams & Company, 1977, pages 32–34.

The following examples are provided to illustrate preferred embodiments of the present invention. They are not intended to limit the scope of this disclosure to the embodiments exemplified therein. All percentages are by weight unless specified otherwise.

EXAMPLE 1

Step 1

Preparation of 65/35 (wt/wt) Methyltetracyclododecene (MTD) Vinyl-Norbornene (VNB) Copolymer An unsaturated polynorbornene polymer was obtained in the following manner. Into a septum-capped vessel containing 30 g. of molecular sieves were added 81 g. of dry toluene, 10.22 g. of methyl tetracyclododecene, 5.73 g. vinyl norbornene and 4.90 g. hexene-1. The contents were mixed and this mixture was allowed to stand 30 minutes, then transferred to a second vessel by passing it through a 1 micron filter under nitrogen pressure. The vessel was slightly pressurized with nitrogen. To the mixture 0.23 cc of a 25% solution of ethylaluminum-sesquichloride (EASC cocatalyst) in dry toluene were introduced by syringe. To this mixture, 1.65 cc of a solution of 2 g. of molybdenum pentachloride catalyst in 39 g. of dry ethylacetate and 84 g. of dry toluene, were also introduced by syringe. Within one minute, an exothermic reaction of the mixture resulted and the mixture became a viscous liquid. After 15 minutes, 60 cc of a 88/12 (wt/wt) mixture of 2propanol and water was added to the vessel and the contents shaken to inactivate the catalyst. The top layer containing mostly solvents, residual monomers and low molecular weight polymers was poured off. The semisolid bottom layer was redissolved in 100 cc of toluene, washed with water and dried by azeotropic distillation of part of the solvent.

Polymerization was found to be 91% conversion of monomer as calculated by measuring the percent weight solids of the resulting polymer solution. The glass transition temperature (Tg) was found to be 118° C. in the second heat, as calculated from a Differential Scanning Calorimetry curve of a sample of the polymer that was diluted in toluene, precipitated into methanol with stirring, filtered and dried.

Step 2

Preparation of Prepreg

The prepreg formulation used consisted of a 23% solution of a 65/35 (wt/wt) copolymer of methyltetracyclodocene (MTD) and 5-vinyl-2-norbornene (VNB) also containing 3.5 phr of Lupersol 130, peroxide from Penwalt Co. Lucidol Division, and 1 phr of Irganox 1010 antioxidant from Ciba-Geigy Co. The polymer had a dilute solution viscosity (DSV) in toluene of 0.5 and it was obtained by ring opening polymerization of above monomers in toluene, in the presence of hexene-1 as a molecular weight modifier, using molybdenum pentachloride and ethyl-aluminum sesquichloride as the catalyst system.

The above formulation was impregnated, by dipping, onto a glass cloth style 2116, having a finish 642 from Burlington Industries. After air drying to a tack-free condition, the residual solvent was eliminated in a mechanical convection oven for 15 minutes at 50° C., 15 at 75° C., 20 at 100° C. and 10 at 130° C. The residual amount of volatiles was measured to be below 2.5% at 200° C. by Thermogravimetric Analysis.

Step 3

Pretreatment of Copper Foil with a Silane

A commercially available electrodeposited copper foil (product of Gould, Inc.) typically used for fabricating general purpose epoxy printed wiring boards was prepared for laminating to the prepreg. The foil, as purchased, weighed 1 oz. per ft.$^2$, was 35 microns thick and had a roughened matte bronze surface on one side. The treatment method used to roughen the surface is proprietary to Gould, Inc.

The copper foil was treated by dipping for 1 minute in a 0.4% solution of 3-(N-styrylmethyl-2-aminoethyl-)aminopropyltrimethoxysilane hydrochloride (from Petrarch Systems) in methanol. After air drying and a 5 minute short bake at 105° C. the foil was ready for lamination.

Step 4

Lamination of Copper Foil to the Prepreg

The above prepregs having an approximate thickness of 16 mils were laminated into a double sided printed wiring board by stacking them between the treated matte side of the cooper foils together with a commercial 1.5 mil thick polyethylene film (PE). The sequence of the layers was the following: copper/PE/2 prepregs/PE/2 prepregs/PE/copper. The lamination and cure was performed in a hot press from 180° to 220° C. and a pressure of about 1,000 PSI for 15 minutes followed by 45 minutes at 220° C. at a pressure of about 1,000 PSI.

Results

The laminate was subjected to a thermal stress test by immersing the laminate in a molten solder bath at 288° C. for 20 seconds. The laminate passed this test without blistering or delamination. The 180° peel strength was measured to be 13.2 lbs/in. This test is conducted to measure the adhesion strength of ½ in. strips of copper foil that remain after etching. This is measured by the force necessary to remove the ½ in. copper strips when pulled at an angle of 180° from the strip direction in the plane of the wire board. A number of strips are tested and the highest value for peel strength is reported.

The peel strength and solder bath resistance test are at least equivalent to the ASTM D 1867-82 and Military Specification MIL-P-13949F standard tests of 90 degree peel strength and 288 solder bath resistance for 10 seconds.

The coefficient of thermal expansion (CTE) was measured and found to be 89PPM/°C.

EXAMPLE 2

The experiment of Example 1 was repeated except that no adhesion promotion of the copper foil was performed. The laminate showed blisters and a peel strength of below 2 lbs/in. This example shows that the proprietary treatment method used to roughen the surface of the foil is not essential to the performance of this invention.

EXAMPLE 3

The experiment of Example 1 was repeated except that no polyethylene film was employed in the lamination. The copper peel strength of the laminate was measured to be 8.2 lbs/in.

Prepregs were prepared as in Example 1 and stored for 14 days at 50° C. A laminate of the sequence copper foil/PE film/prepregs/PE film/prepregs/copper was prepared. The copper foil was pretreated with a styryl silane solution as indicated above. The lamination was done for 30 minutes in a press at a temperature ranging from 180° to 220° C. and for 45 minutes at a temperature of 220° C. The copper/PE adhesion appeared even better than the non-PE adhesion interface. A 2×3" portion was tested in solder bath at 288° C., exhibiting only a slight bubble at an edge portion. The laminate exhibited peel strength values of 13.0 lbs./inch.

EXAMPLE 5

A laminate in a manner similar to Example 4 was prepared, except that no copper pretreatment was employed. The laminate exhibited bad adhesion and bubbles formed in the solder bath test.

EXAMPLE 6

A laminate was prepared in a manner similar to Example 4 having the sequence copper/PE/prepregs/-PE/prepregs/PE/prepregs/PE/prepregs/PE/copper. The copper was pretreated as above. The laminate. having a major surface dimension of 4×4", passed a molten solder test at 500° and 550° F.

Table 1 summarizes the results of Examples 4–6. In the table, samples A and B correspond to Example 4, C and D correspond to Example 5, and E and F correspond to Example 6.

TABLE 1

| Sample | Peel Strength ($lbs/in^2$) | Strip Width (cm) |
|---|---|---|
| A | 12.8 | 1.00 |
| B | 13.0 | 1.00 |
| C | — | .96 |
| D | — | .95 |
| E | 12.2 | .98 |
| F | 13.7 | .95 |

While this invention has been disclosed in this patent application by reference to the details of preferred embodiments of the invention, it is to be understood that this disclosure is intended in an illustrative rather than in a limiting sense, as it is contemplated that modifications will readily occur to those skilled in the art, within the spirit of the invention and the scope of the appended claims.

What is claimed is:

1. A printed wiring board produced by a process comprising:

(a) providing a dipping solution comprising polynorbornene polymers dissolved within a solvent;

(b) impregnating a [non-cellulosic] *glass* cloth with the dipping solution and drying the impregnated cloth to remove a substantial portion of solvent to form a substrate layer.

(c) pretreating the surface of a conductive film with a solution of silane compound suitable for increasing the bond strength between the substrate layer and the conductive film layer; and (d) sandwiching [an] *and* laminating a layer of polyolefin film derived from $C_2$-$C_4$ monomer *of up to about 10 mils in thickness* on the pretreated surface between the substrate layer and the [copper layer] *conductive film* at a temperature above the glass transition temperature of the polynorbornene [and, when a curing agent is present, sufficiently high to activate said curing agent].

2. A printed wiring board of claim 1 wherein the cloth is a woven or non-woven fiberglass cloth.

3. A printed wiring board of claim 1 wherein the conductive film is copper.

4. A printed wiring board of claim 1 wherein the polyolefin is polyethylene.

5. A printed wiring board of claim 1 wherein the polynorbornene is derived from vinyl-norbornene monomer polymerized with either methyltetracyclododecene or dicyclopentadiene monomers.

6. A printed wiring board of claim 1 wherein the [polynorbornenes] *polynorbornene polymers* are cross-linked with the aid of a curing agent and wherein step (b) is conducted at a temperature below the activation temperature of said curing agent.

7. A printed wiring board of claim 1 wherein the dipping solution further comprises an antioxidant.

8. A printed wiring board of claim [1] *3* wherein the copper film is the surface layer of a metallic film selected from the group consisting of copper, nickel, silver, gold, aluminum, platinum, titanium, zinc, bronze and chromium.

9. A printed wiring board of claim 1 wherein the silane suitable for increasing the bonding strength is selected from the group consisting of 3-methylacryloyloxypropyltrimethoxysilane, 3-(N-styrylmethyl-2-aminoethylamino)propyltrimethoxysilane hydrochloride, 3-(N-allyl-2-aminoethylamino)-propyltrimethoxysilane hydrochloride, N-(styrylmethyl)-3-aminopropyltrimethoxysilane hydrochloride, N-2-aminoethyl-3-aminopropyltrimethoxysilane, and 3-(N-benzyl-2-aminoethylamino)-propyltrimethoxysilane hydrochloride.

10. A printed wiring board of claim 1 wherein then non-cellulosic cloth comprises glass fibers and is pretreated with a styryl diamino silane.

11. A printed [circuit] wiring board of claim 1, which exhibits a peel strength of at least about 6 lbs/inch, a dielectric constant below about 3.5 and a dissipation [faction of less 0.005.] *factor of less than 0.005 at 1 MHZ.*

12. A printed [circuit] wiring board of claim 1, which exhibits a peel strength of at least about 6 lbs/inch, a dielectric constant below about 3.1 and a dissipation [faction of less 0.003] *factor of less than 0.003 at 1 MHZ.*

13. A laminate comprising at least one substrate layer comprising a [non-cellulosic] *glass* cloth which has been impregnated with polynorbornene polymers laminated to at least one layer of conductive film which conductive film has been pretreated on at least one surface thereof with a silane compound suitable for increasing the bond strength between the substrate layer and the [copper] *conductive* film layer, with a layer of polyolefin sandwiched therebetween.

14. A laminate of claim 13 wherein the conductive film is copper and the surface of the copper film which is pretreated has a bronze coating.

15. A laminate of claim 13 wherein the polynorbornene polymer is unsaturated and is derived from a cycloolefin monomer selected from methyltetracyclododecene, vinyl-norbornene and dicyclopentadiene.

16. A laminate of claim 13 wherein the monomers of the polynorbornene polymer are comprised in a weight to weight ratio of about 50–75 percent methyltetracyclododecene to 25–50 percent vinyl-norbornene.

17. A laminate of claim 13 wherein the monomers of the polynorbornene polymer are comprised in weight to weight ratio of about 75–90 percent dicyclopentadiene to about 10–25 percent vinyl-norbornene.

18. A laminate of claim 13 wherein the dipping solution further comprises a curing agent which initiates radical cross-linking.

19. A laminate of claim 13 wherein the silane is selected from the group consisting of 3-methylacryloyloxypropyltrimethoxysilane,
3-(N-styrylmethyl-2-aminoethylamino)propyltrimethoxysilane hydrochloride,
3-(N-allyl-2-aminoethylamino)-propyltrimethoxysilane hydrochloride,
N-(styrylmethyl)-3-aminopropyltrimethoxysilane hydrochloride,
N-2-aminoethyl-3-aminopropyltrimethoxysilane, and
3-(N-benzyl-2-aminoethylamino)-propyltrimethoxy silane hydrochloride.

20. A laminate of claim [13] *14* further comprising placing two or more substrate layers in a stacking sequence with copper layers at the outside of the stack.

21. A laminate of claim 20 wherein a sheet of polyolefin is sandwiched between the substrate layers.

22. A laminate of claim 13 wherein the cloth is impregnated with from 30% to 80% by weight polynorbornene polymer.

[23. A laminate of claim 13 wherein the thickness of the polyolefin sheet, prior to lamination, is less than or equal to about 10 mils.]

24. A laminate of claim [23] *1* wherein the thickness of the polyolefin sheet, prior to lamination, [is less than or equal ] *has a thickness of up* to about 5 mils.

25. A laminate of claim 24 wherein the thickness of the polyolefin sheet, prior to lamination, [is less than or equal ] *has a thickness of up* to about 1.5 mils.

26. A laminate of claim 13 wherein the polyolefin is polyethylene.

27. A process for producing a laminate, comprising:

(a) providing a dipping solution comprised of polynorbornene polymers dissolved within a solvent;
(b) impregnating [an on-cellulosic] *a glass* cloth with the dipping solution and drying the impregnated cloth to remove a substantial portion of solvent to form a prepreg to function as a substrate layer;
(c) pretreating the surface of a conductive film with a solution of a silane compound suitable for increasing the bond strength between the substrate layer and the conductive film layer; and
(d) sandwiching and laminating a layer of polyolefin film derived from $C_2$–$C_4$ monomers *of up to about 10 mils thickness* on the pretreated surface between the substrate layer and the [copper layer, ] *conductive film* at a temperature above the glass transition temperature of the polynorbornene [and, when a curing agent is present, sufficiently high to activate said curing agent].

28. A process of claim 27 wherein the conductive film is copper and the surface of the copper film which is pretreated has a bronze coating.

29. A process of claim 27 wherein the polynorbornene polymer is unsaturated and is derived from a cycloolefin monomer selected from methyltetracyclododecene, vinyl-norbornene and dicyclopentadiene.

30. A process of claim 27 wherein the monomers of the polynorbornene polymer are comprised in a weight to weight ratio of about 50–75 percent methyltetracyclododecene to 25–50 percent vinyl-norbornene.

31. A process of claim 27 wherein the monomers of the polynorbornene polymer are comprised in weight to weight ratio of about 75–90 percent dicyclopentadiene to about 10–25 percent vinyl-norbornene.

32. A process of claim 27 wherein the dipping solution further comprises a curing agent which initiates radical cross-linking and wherein step (b) is conducted at a temperature below the activation temperature of said curing agent.

33. A process of claim 27 wherein the silane is selected from the group consisting of 3-methylacryloyloxypropyltrimethoxysilane,
3-(N-styrylmethyl-2-aminoethylamino)propyltrimethoxysilane hydrochloride,
3-(N-allyl-2-aminoethylamino)-propyltrimethoxysilane hydrochloride,
N-(styrylmethyl)-3-aminopropyltrimethoxysilane hydrochloride,
N-2-aminoethyl-3-aminopropyltrimethoxysilane, and
3-(N-benzyl-2-aminoethylamino)-propyltrimethoxy silane hydrochloride.

[34. A process of claim 27 wherein the lamination is performed at a temperature above the glass transition temperature of the polynorbornene.]

35. A process of claim 27 wherein the lamination is performed at temperatures between about ambient and about 250° C. and at a pressure of from about 1000 to about 1100 SI.

36. A process of claim [27] *28* further comprising placing two or more substrate layers in a stacking sequence with copper layers at the outside of the stack.

37. A process of claim 36 wherein a sheet of polyolefin is sandwiched between the substrate layers.

38. A process of claim 27 wherein the cloth is impregnated with from 30% to 90% by weight polynorbornene polymer.

[39. A process of claim 27 wherein the thickness of the polyolefin sheet prior to lamination, is less than or equal to about 10 mils.]

40. A process of claim [39] *27* wherein the [thickness of the] polyolefin sheet, prior to lamination, [is less than or equal] *has a thickness of up* to about 5 mils.

41. A process of claim 40 wherein the [thickness of the] polyolefin sheet, prior to lamination, [is less than or equal] *has a thickness of up* to about 1.5 mils.

42. A process of claim 27 wherein the polyolefin is polyethylene.

43. A process of claim [27] *28* further comprising the steps of:

(e) exposing the surface of the copper layer of step (d) to photoresist imaging conditions and etching the copper layer to form a copper pattern on the surface of the laminate;
(f) repeating steps (b) and (c) to produce a prepreg layer and a treated film layer;
(g) arranging the pattern laminate from step (e), one or more prepreg layers and treated film layer from step (f) in the sequence laminate/prepreg layer(s)-/copper film layer, optionally with a layer of polyolefin derived from a $C_2$–$C_4$ monomer *of up to about 10 mils in thickness* between the laminate/- prepreg layer(s) and optionally between the prepreg layer(s)/ and the copper film layer; and (h) laminating the sequence of step (g).

44. A process of claim 43 wherein the copper-patterned surface of step (e) is oxidized with an oxidizing agent.

45. A process for producing a laminate, comprising:

(a) providing a *dipping* solution comprised of polynorbornene polymers selected from copolymers comprising, in a weight-to-weight ratio of about
  (i) 50–75% methyltetracyclododecene : 25–50% vinylnorborene, or (ii) about 75–90% dicyclopentadiene: about 10–25% vinyl-norbornene;

(b) impregnating a [non-cellulosic] *glass* cloth with the dipping solution;

(c) drying the impregnated cloth to remove a substantial portion of solvent to form a substrate layer;

(d) pretreating the surface of a conductive film with a solution of a silane compound suitable for increasing the bond strength between the substrate layer and the [copper] *conductive* film layer; and (e) sandwiching and laminating a layer of polyolefin film derived from $C_2$–$C_4$ monomers *of up to about 10 mils in thickness* on the pretreated surface between the substrate layer and the conductive layer at a temperature above the glass transition temperature of the polynorbornene [and, where a curing agent is present, sufficiently high to activate said curing agent].

46. A printed circuit wiring board prepared by the process of claim 45.

*47. A printed wiring board of claim 1 wherein said dipping solution of (a) further comprises a curing agent which initiates radical cross-linking.*

*48. A printed wiring board of claim 45 wherein said dipping solution of (a) further comprises a curing agent which initiates radical cross-linking.*

* * * * *